(12) United States Patent
Ahn

(10) Patent No.: US 11,276,703 B2
(45) Date of Patent: Mar. 15, 2022

(54) SEMICONDUCTOR MEMORY DEVICE

(71) Applicant: SK hynix Inc., Icheon-si (KR)

(72) Inventor: Kyung Hun Ahn, Seoul (KR)

(73) Assignee: SK hynix Inc., Icheon-si (KR)

( * ) Notice: Subject to any disclaimer, the term of this patent is extended or adjusted under 35 U.S.C. 154(b) by 1 day.

(21) Appl. No.: 15/930,964

(22) Filed: May 13, 2020

(65) Prior Publication Data

US 2021/0183879 A1  Jun. 17, 2021

(30) Foreign Application Priority Data

Dec. 12, 2019 (KR) .................... 10-2019-0165376

(51) Int. Cl.
| | |
|---|---|
| *H01L 27/11573* | (2017.01) |
| *G11C 16/06* | (2006.01) |
| *H01L 27/11582* | (2017.01) |
| *H01L 27/02* | (2006.01) |
| *H01L 27/11556* | (2017.01) |
| *H01L 27/1157* | (2017.01) |
| *H01L 27/11524* | (2017.01) |

(52) U.S. Cl.
CPC ........ *H01L 27/11573* (2013.01); *G11C 16/06* (2013.01); *H01L 27/0248* (2013.01); *H01L 27/1157* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 2004/0066685 A1* | 4/2004 | Choi | ................. G11C 16/3418 365/202 |
| 2020/0020712 A1* | 1/2020 | Kim | ................. H01L 27/11565 |

FOREIGN PATENT DOCUMENTS

| | | |
|---|---|---|
| KR | 10-2011-0102100 A | 9/2011 |
| KR | 10-2015-0106660 A | 9/2015 |

* cited by examiner

*Primary Examiner* — Hsien Ming Lee

(57) ABSTRACT

A semiconductor memory device includes a logic circuit disposed on a substrate having a cell region and a peripheral region outside the cell region; a source plate defined over the logic circuit; a slit separating the source plate into a cell source plate in the cell region and a dummy source plate in the peripheral region; and a memory cell array defined on the cell source plate. The dummy source plate is maintained at a constant voltage independent of operations of the memory cell array and the logic circuit.

20 Claims, 14 Drawing Sheets

FIG.5
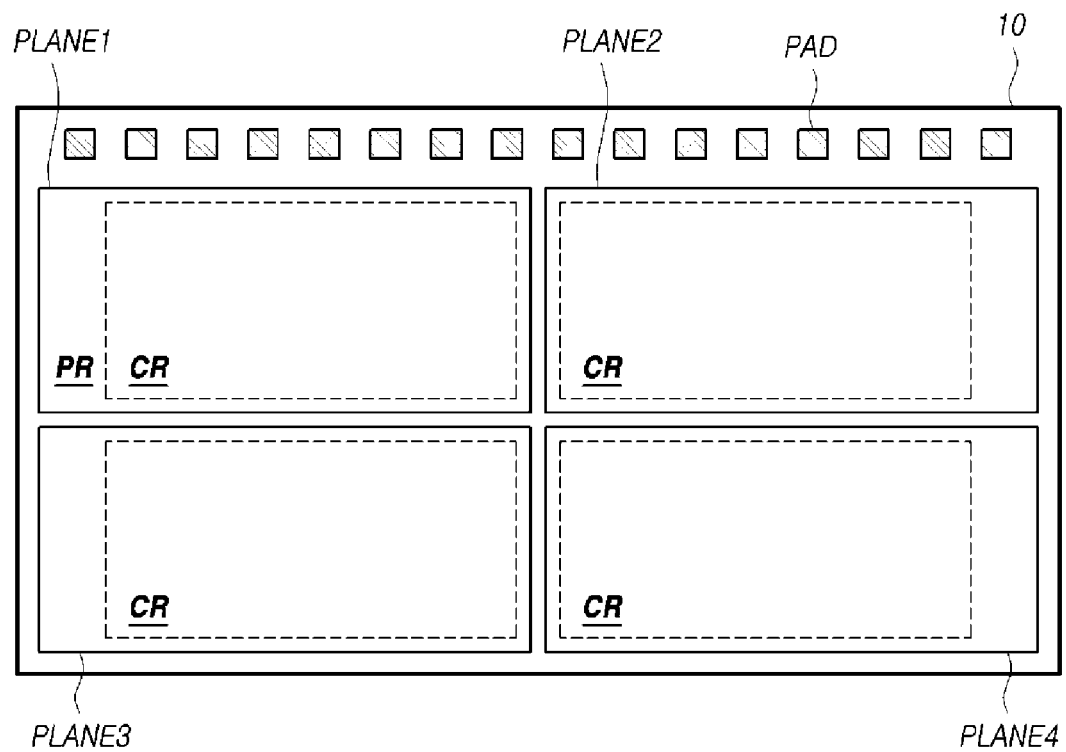
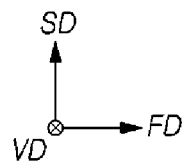

SEMICONDUCTOR MEMORY DEVICE

CROSS-REFERENCE TO RELATED APPLICATION

The present application claims priority under 35 U.S.C. § 119(a) to Korean Patent Application No. 10-2019-0165376 filed in the Korean Intellectual Property Office on Dec. 12, 2019, which is incorporated herein by reference in its entirety.

BACKGROUND

1. Technical Field

Various embodiments generally relate to a semiconductor memory device, and, more particularly, to a semiconductor memory device having a logic circuit disposed under a memory cell array.

2. Related Art

With the development of semiconductor manufacturing technology, miniaturization and high integration of semiconductor memory devices are demanded. To satisfy the demand for high integration, a peripheral under cell (PUC) structure has been proposed in which a logic circuit is disposed under a memory cell array.

Electrostatic discharge (ESD) is a failure mode that occurs as static electricity flows. Electrostatic current resulting from ESD can cause damage to elements of semiconductor memory devices such as diodes and transistors. For example, a high current generated by ESD, applied to the PN junction of a diode, can cause a junction spike, or may destroy the gate dielectric layer of a transistor to short a gate, a drain and a source. Therefore, manufacturers make various efforts to protect elements from ESD.

SUMMARY

Various embodiments are directed to a semiconductor memory device capable of reducing damage due to ESD.

In an embodiment, a semiconductor memory device may include: a logic circuit disposed on a substrate having a cell region and a peripheral region outside the cell region; a source plate defined over the logic circuit; a slit separating the source plate into a cell source plate in the cell region and a dummy source plate in the peripheral region; and a memory cell array defined on the cell source plate. The dummy source plate may be maintained at a constant voltage independent of operations the memory cell array and the logic circuit.

In an embodiment, a semiconductor memory device may include: a logic circuit defined on a substrate having a cell region and a peripheral region outside the cell region; a cell source plate disposed over the logic circuit in the cell region; a memory cell array defined on the cell source plate; and an electrostatic discharge shield plate disposed over the logic circuit, and provided in the peripheral region.

In an embodiment, a semiconductor memory device may include: a logic circuit defined on a substrate; a source plate disposed over the logic circuit; a slit separating the source plate into a plurality of cell source plates and a dummy source plate; and a plurality of memory cell arrays defined on the cell source plates, respectively. The dummy source plate may be maintained at a constant voltage regardless of whether the memory cell arrays and the logic circuit operate.

BRIEF DESCRIPTION OF THE DRAWINGS

FIG. 5 is a top view illustrating a schematic layout of the semiconductor memory device illustrated in FIG. 4.

DETAILED DESCRIPTION

Figure 1:
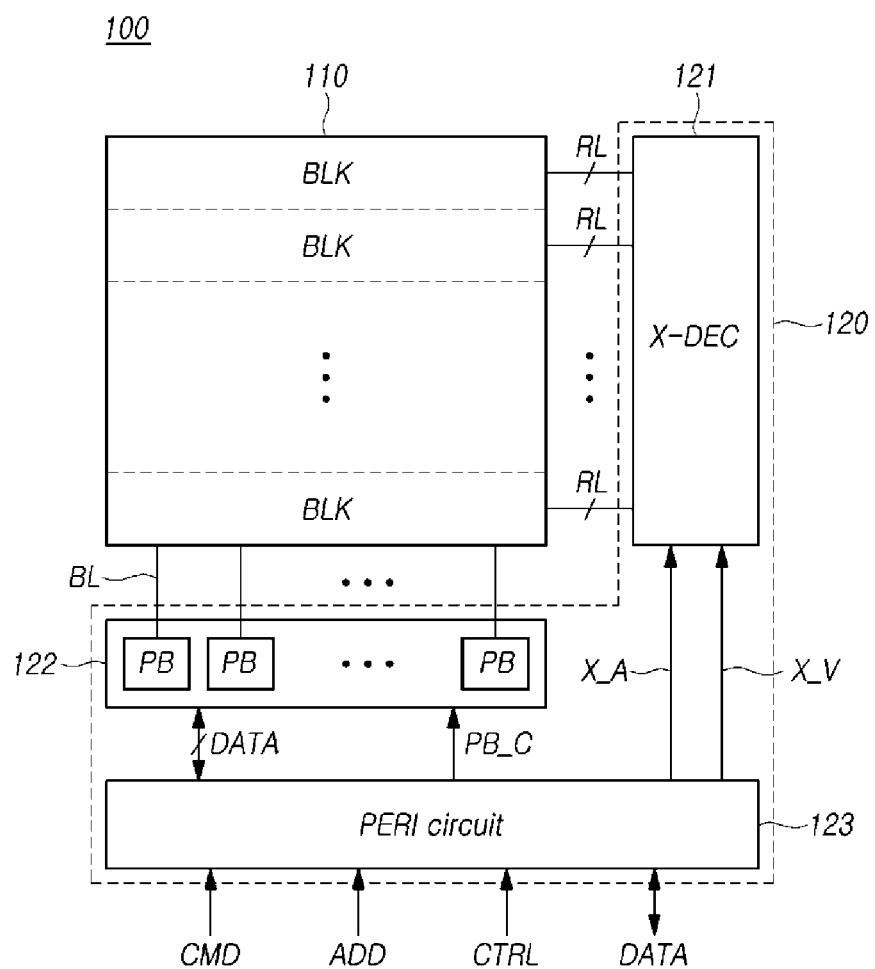
FIG. 1 is a block diagram illustrating a representation of a semiconductor memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Elements in embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, various examples of embodiments of the disclosure will be described in detail with reference to the accompanying drawings.

FIG. 1 is a block diagram illustrating a representation of a semiconductor memory device in accordance with an embodiment of the disclosure.

Referring to FIG. 1, a semiconductor memory device 100 in accordance with an embodiment of the disclosure may include a memory cell array 110 and a logic circuit 120. The logic circuit 120 may include a row decoder (X-DEC) 121, a page buffer circuit 122, and a peripheral circuit (PERI circuit) 123.

The memory cell array 110 may include a plurality of memory blocks BLK. While not illustrated, each of the memory blocks BLK may include a plurality of cell strings. Each cell string may include at least one drain select transistor, a plurality of memory cells and at least one source select transistor, which are coupled in series. Each memory cell may be a volatile memory cell or a nonvolatile memory cell. While it will be described below that the semiconductor memory device 100 is a vertical NAND flash device, it is to be understood that the technical spirit of the disclosure is not limited thereto.

The memory cell array 110 may be coupled to the row decoder 121 through row lines RL. The row lines RL may include at least one drain select line, a plurality of word lines and at least one source select line.

The row decoder 121 may select any one among the memory blocks BLK included in the memory cell array 110 in response to a row address X_A provided from the peripheral circuit 123. The row decoder 121 may transfer an operating voltage X_V, provided from the peripheral circuit 123, to row lines RL coupled to a memory block BLK that is selected from among the memory blocks BLK included in the memory cell array 110.

The memory cell array 110 may be coupled to the page buffer circuit 122 through bit lines BL. The page buffer circuit 122 may include a plurality of page buffers PB, which are coupled to the bit lines BL, respectively. The page buffer circuit 122 may receive a page buffer control signal PB_C from the peripheral circuit 123 and may transmit and receive a data signal DATA to and from the peripheral circuit 123. The page buffer circuit 122 may control a bit line BL, which is arranged in the memory cell array 110, in response to the page buffer control signal PB_C. For example, the page buffer circuit 122 may detect data stored in a memory cell of the memory cell array 110 by sensing the signal of a bit line BL of the memory cell array 110 in response to the page buffer control signal PB_C, and may transmit the data signal DATA to the peripheral circuit 123 depending on the detected data. The page buffer circuit 122 may apply a signal to a bit line BL based on the data signal DATA received from the peripheral circuit 123 in response to the page buffer control signal PB_C, and thereby, may write data in a memory cell of the memory cell array 110. The page buffer circuit 122 may write or read data in or from a memory cell which is coupled to a word line activated by the row decoder 121.

The peripheral circuit 123 may receive a command signal CMD, an address signal ADD and a control signal CTRL from outside the semiconductor memory device 100, and may transmit and receive data DATA to and from a device outside the semiconductor memory device 100, such as a memory controller. The peripheral circuit 123 may output signals for writing data in the memory cell array 110 or reading data from the memory cell array 110, for example, the row address X_A, the page buffer control signal PB_C and so forth, based on the command signal CMD, the address signal ADD and the control signal CTRL. The peripheral circuit 123 may generate various voltages including the operating voltage X_V, which are required in the semiconductor memory device 100.

Hereinbelow, in the accompanying drawings, two directions that are parallel to the top surface of a substrate and intersect with each other are defined as a first direction FD and a second direction SD, respectively, and a direction that vertically protrudes from the top surface of the substrate is defined as a vertical direction VD. For example, the first direction FD may correspond to the extending direction of word lines or the arrangement direction of bit lines, and the second direction SD may correspond to the extending direction of the bit lines or the arrangement direction of the word lines. The first direction FD and the second direction SD may substantially perpendicularly intersect with each other. In the drawings, a direction indicated by an arrow and a direction opposite thereto represents the same direction.

Figure 2:
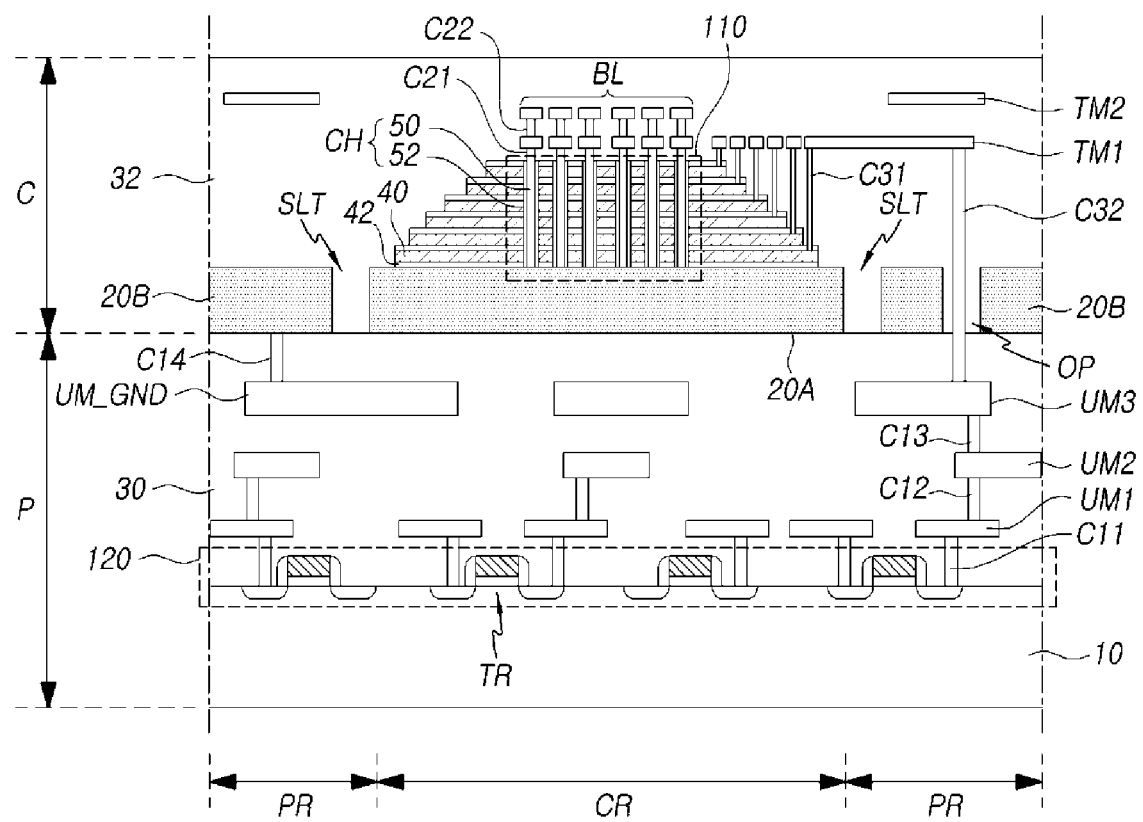
FIG. 2 is a cross-sectional view illustrating a representation of a semiconductor memory device in accordance with an embodiment of the disclosure.

FIG. 2 is a cross-sectional view illustrating a representation of a semiconductor memory device in accordance with an embodiment of the disclosure.

Referring to FIG. 2, a semiconductor memory device 100 in accordance with the embodiment of the disclosure may have a PUC (peripheral under cell) structure. A logic structure P may be disposed under a memory structure C.

The logic structure P may include a substrate 10 and the logic circuit 120, which is disposed on the substrate 10. The substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. The logic circuit 120 may include transistors TR which are disposed on active regions defined by an isolation layer (not illustrated). While not illustrated, the logic circuit 120 may further include capacitors, inductors, and so forth. The logic circuit 120 may include the row decoder 121, the page buffer circuit 122 and the peripheral circuit 123 described above with reference to FIG. 1.

A bottom dielectric layer 30 may be defined on the substrate 10 to cover the logic circuit 120. The bottom dielectric layer 30 may include silicon oxide, such as HDP (high density plasma) oxide or TEOS (tetra-ethyl-orthosilicate) oxide.

A plurality of bottom wiring lines, UM1, UM2 and UM3 (UM1 to UM3), may be defined in the bottom dielectric layer 30. The bottom wiring lines UM1 to UM3 may include, for example, first to third bottom wiring lines UM1 to UM3, which are disposed at different layers in the vertical direction VD. The second bottom wiring lines UM2 may be disposed at a layer higher than the first bottom wiring lines UM1. The third bottom wiring lines UM3 may be disposed at a layer higher than the second bottom wiring lines UM2. The first bottom wiring lines UM1 may be coupled to the logic circuit 120 through contacts C11. The second bottom wiring lines UM2 may be coupled to the first bottom wiring lines UM1 through contacts C12. The third bottom wiring lines UM3 may be coupled to the second bottom wiring lines UM2 through contacts C13.

The memory structure C may include a source plate 20 and the memory cell array 110. The semiconductor memory device 100, and the substrate 10, may be divided into a central cell region CR and a peripheral region PR outside the cell region CR. A slit SLT may be defined in the source plate 20 to separate the source plate 20 into a cell source plate 20A and a dummy source plate 20B. The cell source plate 20A may be disposed in the cell region CR, and the dummy source plate 20B may be disposed in the peripheral region PR. The cell source plate 20A and the dummy source plate 20B may be formed in the same process step and may be made of the same conductive material. For instance, the cell source plate 20A and the dummy source plate 20B may include at least one of polysilicon, tungsten (W), copper (Cu) and aluminum (Al).

The memory cell array 110 may include a plurality of vertical channels CH, which are disposed on the cell source plate 20A, and a plurality of electrode layers 40 and a plurality of interlayer dielectric layers 42, which are alternately stacked along the vertical channels CH.

The electrode layers 40 may include a conductive material. For example, the electrode layers 40 may include at least one selected among a doped semiconductor, a metal, a conductive metal nitride or a transition metal. The interlayer dielectric layers 42 may include silicon oxide. The electrode layers 40 may constitute the row lines RL illustrated in FIG. 1. Among the electrode layers 40, at least one electrode layer 40 when viewed from the lowermost electrode layer 40 may constitute a source select line, and at least one electrode layer 40 when viewed from the uppermost electrode layer 40 may constitute a drain select line. The electrode layers 40 between the source select line and the drain select line may constitute word lines.

Each of the vertical channels CH may include a channel layer 50 and a gate dielectric layer 52. The channel layer 50 may include polysilicon or monocrystalline silicon and may include a P-type impurity such as boron (B) in some regions thereof. The channel layer 50 may have the shape of a pillar which is completely filled up to the central region thereof or a solid cylinder. In other embodiments not illustrated here, the channel layer 50 may have the shape of a hollow tube. In such cases, a buried dielectric layer may be formed inside the hollow tube and fill the open areas inside of the channel layer 50. The gate dielectric layer 52 may have the shape of a straw or a cylindrical shell which surrounds an outer wall of the channel layer 50. While not illustrated in FIG. 2, the gate dielectric layer 52 may include a tunnel dielectric layer, a charge storage layer and a blocking layer, which are sequentially stacked in an inward direction from the outer wall of the channel layer 50. In some embodiments, the gate dielectric layer 52 may have an ONO (oxide-nitride-oxide) stack structure in which an oxide layer, a nitride layer and an oxide layer are sequentially stacked. Source select transistors, memory cells and drain select transistors may be defined in regions where the electrode layers 40 surround the vertical channels CH.

A top dielectric layer 32 may be defined on the bottom dielectric layer 30 to cover the cell source plate 20A, the dummy source plate 20B and the memory cell array 110. The top dielectric layer 32 may include silicon oxide, such as HDP oxide or TEOS oxide.

A plurality of top wiring lines TM1 and TM2 may be defined in the top dielectric layer 32. The top wiring lines TM1 and TM2 may include, for example, first top wiring lines TM1 and second top wiring lines TM2, which are disposed in different layers in the vertical direction VD. The second top wiring lines TM2 may be disposed at a layer positioned vertically higher than the first top wiring lines TM1.

Each vertical channel CH of the memory cell array 110 may be coupled to one of the first top wiring lines TM1 through a contact C21. A first top wiring line TM1 coupled to a vertical channel CH may be coupled to one of the second top wiring lines TM2 through a contact C22. Some of the second top wiring lines TM2 may constitute bit lines BL, which are coupled to the vertical channels CH of the memory cell array 110.

The electrode layers 40 may be stacked in a stepwise manner. Each of the electrode layers 40 may have a pad region which is coupled with a contact C31. The bottom end of the contact C31 may be coupled to the pad region of the electrode layer 40, and the top end of the contact C31 may be coupled to one of the first top wiring lines TM1. The first top wiring lines TM1 may be coupled to the third bottom wiring lines UM3 through contacts C32. The third bottom wiring lines UM3 may be coupled to the logic circuit 120 through the contacts C11 to C13 and the bottom wiring lines UM1 and UM2. The electrode layers 40 may be electrically coupled to the logic circuit 120 through the contacts C31, the first top wiring lines TM1, the contacts C32, the third bottom wiring lines UM3, the contacts C13, the second bottom wiring lines UM2, the contacts C12, the first bottom wiring lines UM1 and the contacts C11. Thus, the electrode layers 40 may be provided with operating voltages from the logic circuit 120.

Contacts which couple the top wiring lines TM1 and TM2 and the bottom wiring lines UM1 to UM3 may be defined in the peripheral region PR. For instance, the contacts C32, which couple the first top wiring lines TM1 and the third bottom wiring lines UM3, may be defined in the peripheral region PR. The dummy source plate 20B may have openings OP through which the contacts C32 pass.

In the vertical direction VD, the dummy source plate 20B may overlap with the logic circuit 120 in the peripheral region PR, i.e., the dummy source plate 20B may be located vertically above or over a portion of the logic circuit 120. A constant voltage may be loaded to the dummy source plate 20B independently of the operation of the memory cell array 110 and the logic circuit 120. For example, the constant voltage may be a ground voltage. In this case, at least one of the bottom wiring lines UM1 to UM3 may include a ground wiring line UM_GND, to which the ground voltage is loaded. FIG. 2 illustrates an example in which a third bottom wiring line UM3 is configured as the ground wiring line UM_GND. The dummy source plate 20B may be coupled to the ground wiring line UM_GND through a contact C14, and thereby, may be provided with the ground voltage from the ground wiring line UM_GND. Although the present embodiment illustrates a case in which the potential loaded to the dummy source plate 20B is the ground voltage, it is to be noted that the disclosure is not limited thereto.

The dummy source plate 20B may be maintained at a constant voltage regardless of whether the memory cell array 110 and the logic circuit 120 are operating, and thereby, may operate as a shield to electrostatic discharge (ESD) and suppress ESD from being transferred to the logic circuit 120. The dummy source plate 20B may be defined as an ESD shield plate. The dummy source plate 20B may suppress coupling between the top wiring lines TM1 and TM2, disposed over the memory cell array 110, and the bottom wiring lines UM1 to UM3, disposed under the memory cell array 110 in the peripheral region PR. This prevents or suppresses deterioration in electrical characteristics due to the unnecessary coupling between the top wiring lines TM1 and TM2 and the bottom wiring lines UM1 to UM3.

Figure 3:
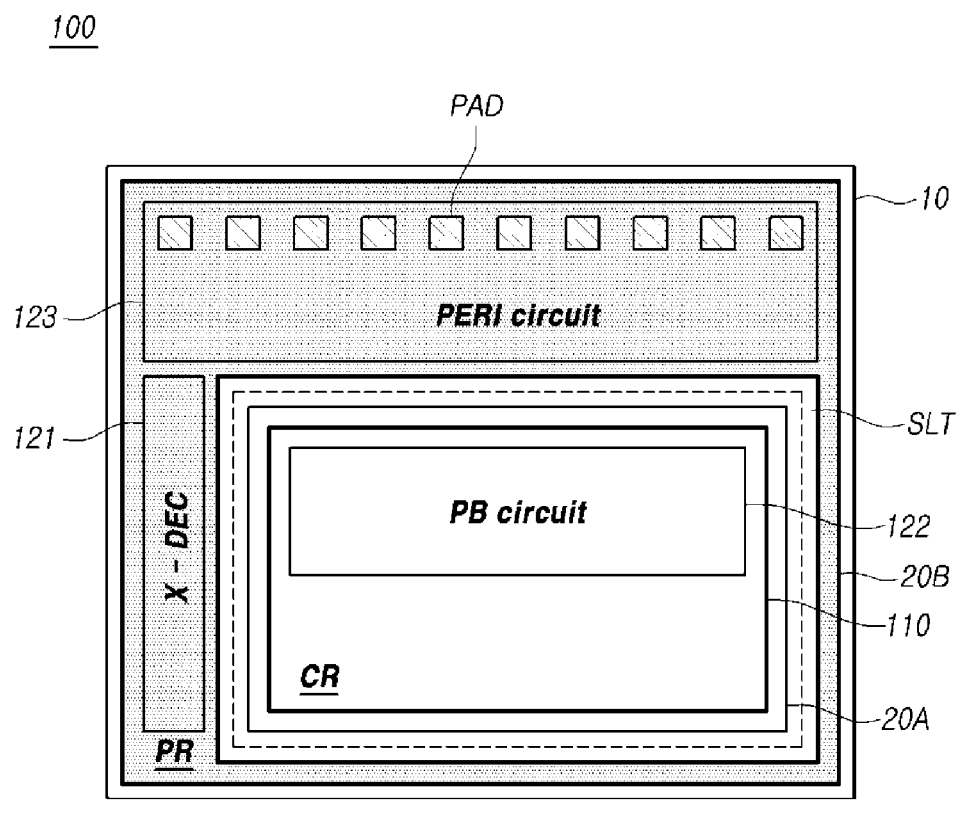
FIG. 3 is a top view illustrating a representation of a semiconductor memory device in accordance with an embodiment of the disclosure.

FIG. 3 is a top view illustrating a representation of a semiconductor memory device in accordance with an embodiment of the disclosure.

Referring to FIG. 3, the row decoder 121, the page buffer circuit 122 and the peripheral circuit 123, together constituting the logic circuit 120, may be disposed on the substrate 10. In FIG. 3, the dotted line represents the boundary between the cell region CR and the peripheral region PR. In the present embodiment, the row decoder 121 and the peripheral circuit 123 may be disposed in the peripheral region PR, while the page buffer circuit 122 may be disposed in the cell region CR.

The source plate 20 may be disposed over the logic circuit 120. The slit SLT may divide the source plate 20 along the boundary between the cell region CR and the peripheral region PR. The source plate 20 may be separated into the cell source plate 20A and the dummy source plate 20B by the slit SLT. The cell source plate 20A and the dummy source plate 20B may be physically and electrically isolated from each other by the slit SLT. The cell source plate 20A may be disposed in the cell region CR, and the dummy source plate 20B may be disposed in the peripheral region PR.

The memory cell array 110 may be disposed on the cell source plate 20A. When viewed from the top, the row decoder 121 may be disposed adjacent to the memory cell array 110 in the first direction FD. The row decoder 121 may extend in the second direction SD, which is also the arrangement direction of row lines. Although FIG. 3 illustrates a row decoder 121 that does not overlap with a memory cell array 110 in the vertical direction VD, it is to be noted that the disclosure is not limited thereto. In other embodiments, at least a portion of the row decoder 121 may overlap with the memory cell array 110 in the vertical direction VD.

The page buffer circuit 122 may overlap with the memory cell array 110 in the vertical direction VD. The page buffer circuit 122 may be disposed to extend in the first direction FD, which is also the arrangement direction of bit lines.

Input/output pads PAD may be disposed in the first direction FD in the peripheral region PR. Input/output pads PAD may be external contacts of the semiconductor memory device 100 for electrical coupling with an external device, such as a printed circuit board(not illustrated here). When viewed from the top, the peripheral circuit 123 may be disposed adjacent to the memory cell array 110 in the second direction SD. A portion of the peripheral circuit 123 may overlap with the input/output pads PAD in the vertical direction VD.

In the peripheral region PR, the dummy source plate 20B may overlap with the logic circuit 120, such as the row decoder 121 and the peripheral circuit 123 in the vertical direction VD. The dummy source plate 20B may be maintained at the constant voltage independent of the operations of the memory cell array 110 and the logic circuit 120, thereby acting as a shield for the logic circuit 120 against ESD.

Figure 4:
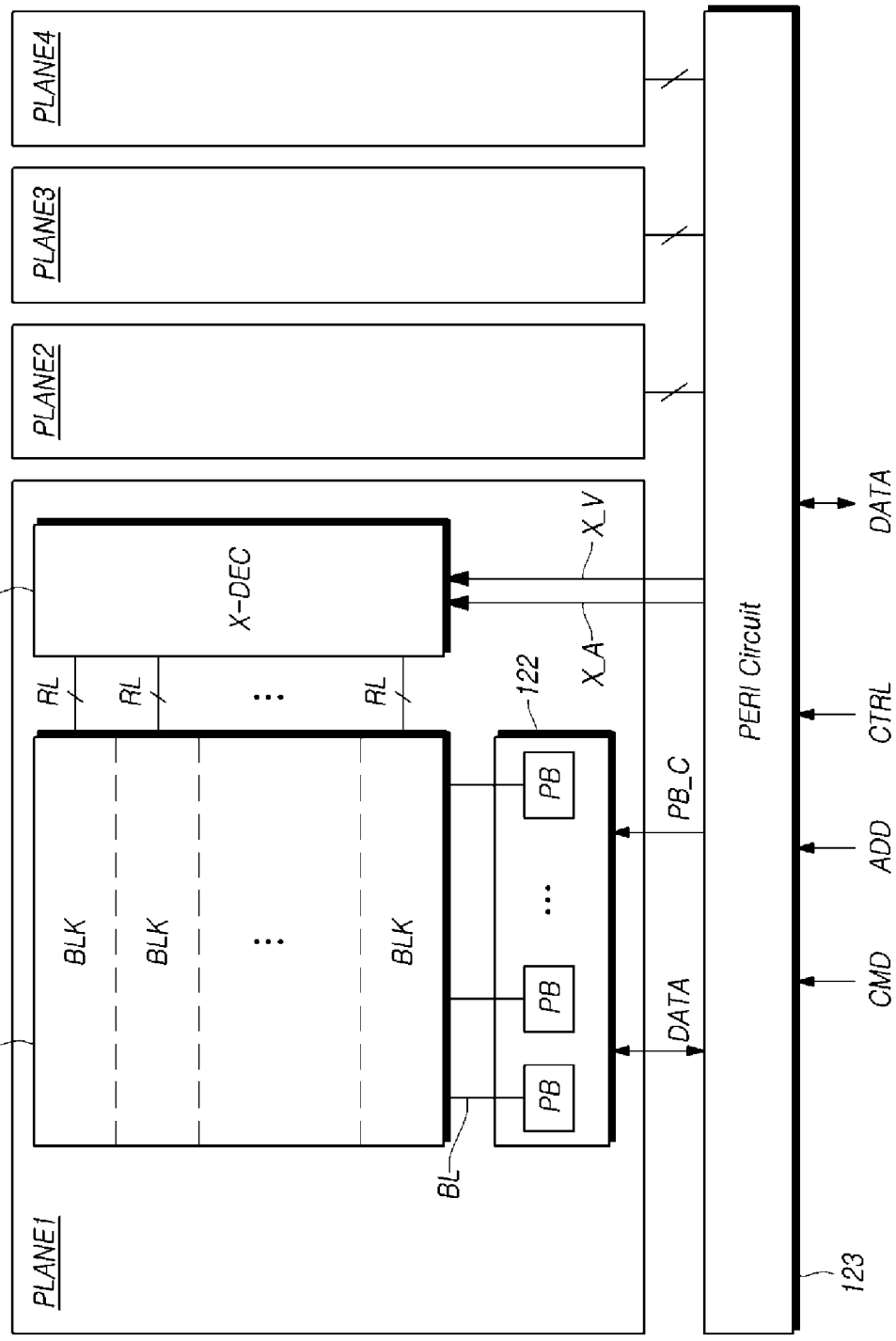
FIG. 4 is a block diagram illustrating a representation of a semiconductor memory device in accordance with an embodiment of the disclosure.
Figure 6:
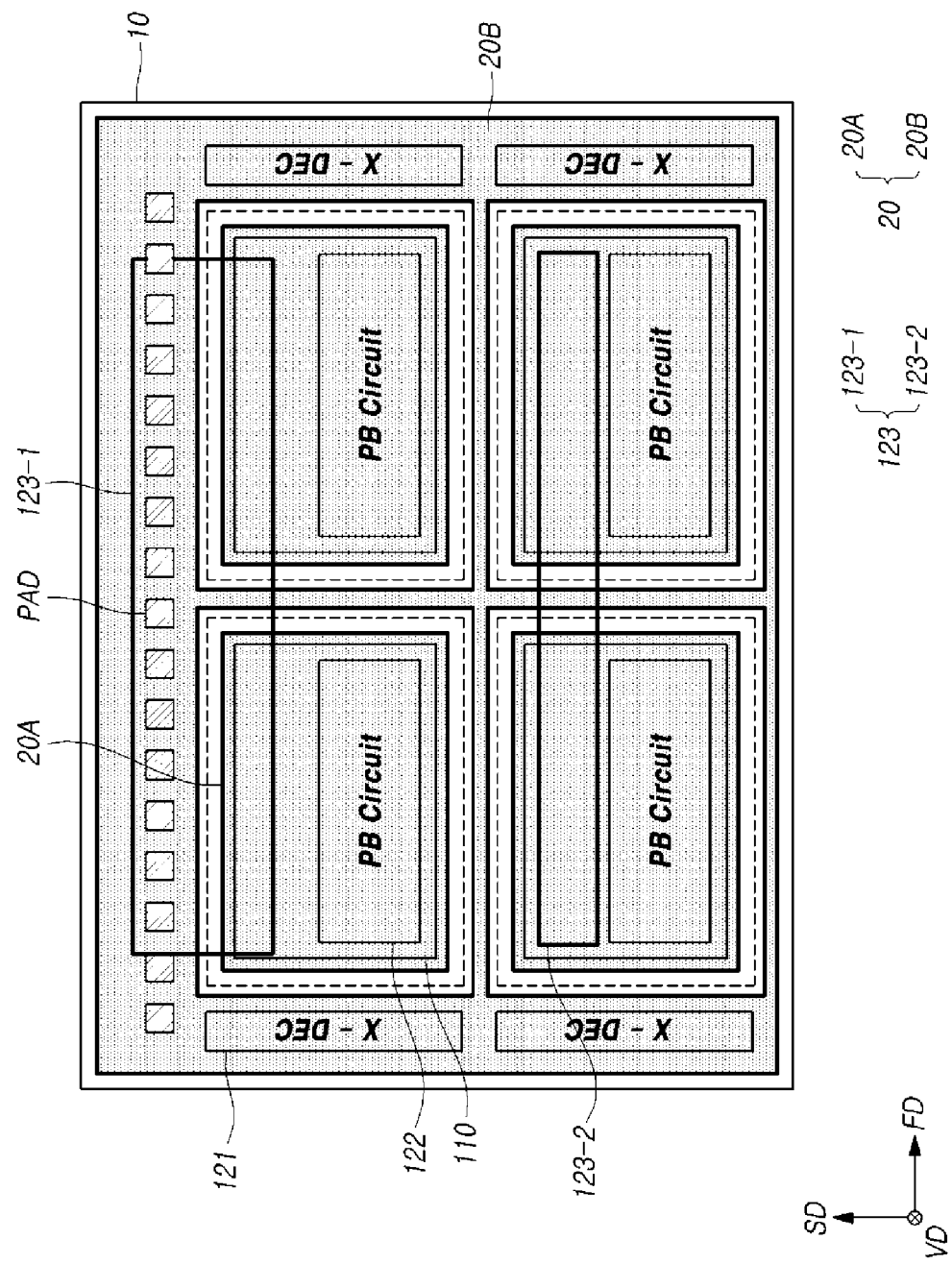
FIG. 6 is a detailed top view of FIG. 5.
Figure 7:
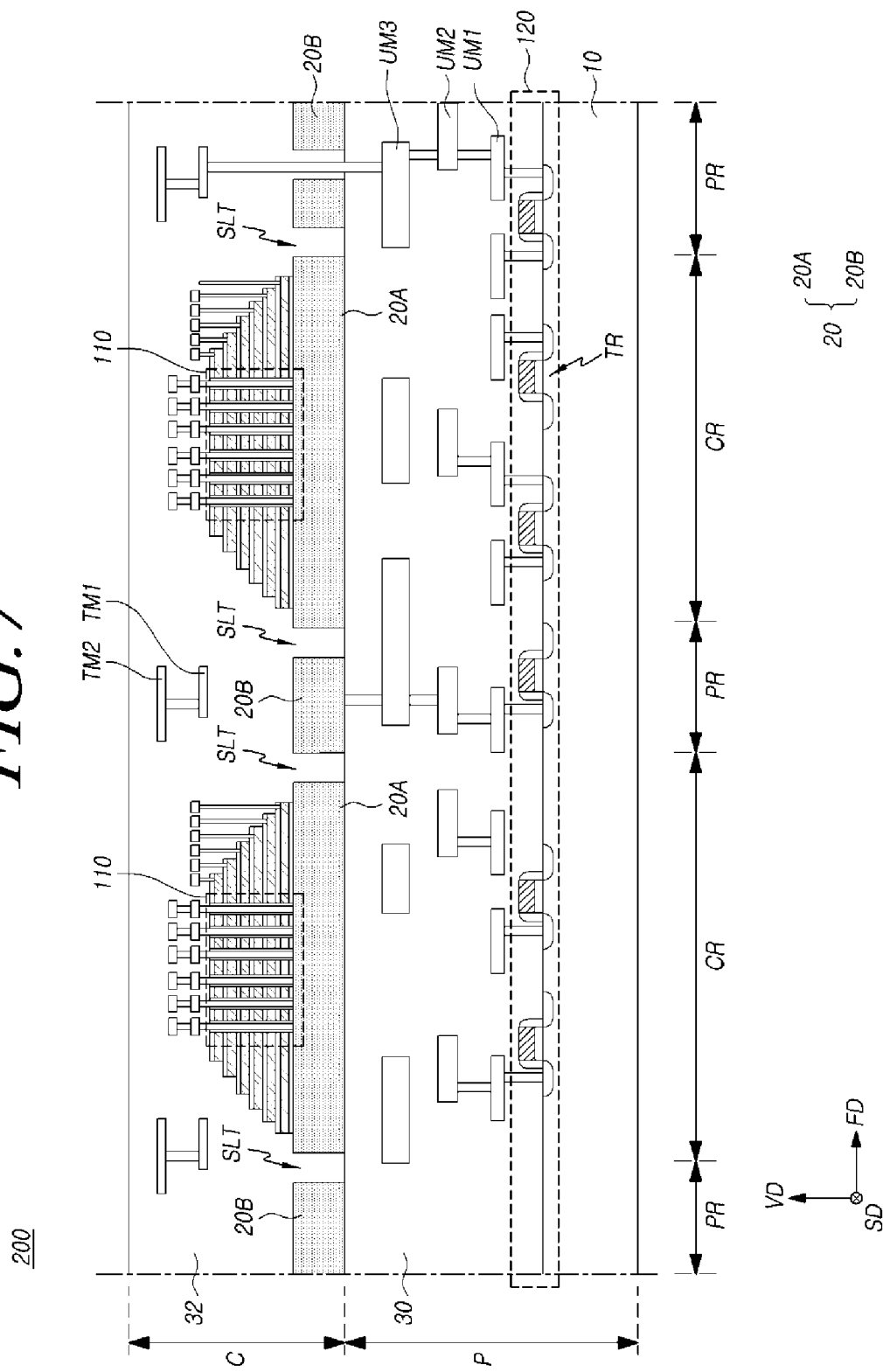
FIG. 7 is a cross-sectional view illustrating a representation of the semiconductor memory device illustrated in FIG. 5.

FIG. 4 is a block diagram illustrating a representation of a semiconductor memory device in accordance with an embodiment of the disclosure. FIG. 5 is a top view illustrating a schematic layout of the semiconductor memory device illustrated in FIG. 4. FIG. 6 is a detailed top view of FIG. 5, and FIG. 7 is a cross-sectional view illustrating a representation of the semiconductor memory device illustrated in FIG. 5.

Referring to FIG. 4, a semiconductor memory device 200 may include a plurality of planes PLANE1 to PLANE4. The semiconductor memory device 200 may have a multi-plane structure. FIGS. 4 to 6 illustrate a 4-plane structure.

Each of the planes PLANE1 to PLANE4 may include a memory cell array 110, a row decoder 121 and a page buffer circuit 122. The planes PLANE1 to PLANE4 may share a peripheral circuit 123.

Referring to FIG. 5, when viewed from the top, the planes PLANE1 to PLANE4 may be disposed in the form of a 2×2 matrix in the first direction FD and the second direction SD. A substrate 10, and the semiconductor memory device 200, may be divided into a plurality of cell regions CR corresponding to the plurality of planes PLANE1 to PLANE4, respectively, and a peripheral region PR outside the cell regions CR. In FIG. 5, the dotted lines represent the boundaries between the cell regions CR and the peripheral region PR. Input/output pads PAD may be disposed in the first direction FD adjacent to an edge of the substrate 10.

Referring to FIGS. 5 to 7, a logic circuit 120 may be defined on the substrate 10. The logic circuit 120 may include the row decoders 121 and the page buffer circuits 122, which are included in the planes PLANE1 to PLANE4 of FIG. 4, and the peripheral circuit 123, which are shared by the planes PLANE1 to PLANE4. A bottom dielectric layer 30 may be defined on the substrate 10 to cover the logic circuit 120. A source plate 20 may be disposed on the bottom dielectric layer 30. The source plate 20 may be separated into a plurality of cell source plates 20A and dummy source plate 20B by slits SLT. The slits SLT may divide the source plate 20 along the boundaries between the cell regions CR and the peripheral region PR. The cell source plates 20A may be disposed in the cell regions CR, and the dummy source plate 20B may be disposed in the peripheral region PR, respectively.

The cell source plates 20A may be disposed adjacent to one another in the first direction FD and the second direction SD. The dummy source plate 20B may be disposed between adjacent cell source plates 20A and the outer periphery of the cell source plates 20A. In each of the planes PLANE1 to PLANE4, a memory cell array 110 may be disposed on each cell source plate 20A.

In FIG. 6, the peripheral circuit 123 may be disposed in two separate regions each extending in the first direction FD and spaced apart in the second direction SD. Hereinafter, for the sake of convenience in explanation, a first peripheral circuit 123-1 is located near the edge of the substrate 10 adjacent to which the input/output pads PAD. A second peripheral circuit 123- is disposed in a more central part of the substrate 10 relative to the first peripheral circuit 123-1.

As illustrated in FIG. 6, a portion of the first peripheral circuit 123-1 may overlap with portions of the memory cell arrays 110 of the first and second planes PLANE1 and PLANE2 in the vertical direction VD. A portion of the first peripheral circuit 123-1 may also overlap with the input/output pads PAD in the vertical direction VD. A portion of the second peripheral circuit 123-2 may overlap with portions of the memory cell arrays 110 of the third and fourth planes PLANE3 and PLANE4 in the vertical direction VD. By disposing the first peripheral circuit 123-1 to overlap with the memory cell arrays 110 of the first and second planes PLANE1 and PLANE2 and the input/output pads PAD, and by disposing the second peripheral circuit 123-2 to overlap with the memory cell arrays 110 of the third and fourth planes PLANE3 and PLANE4, it is possible to reduce the size of the semiconductor memory device 200.

Referring again to FIGS. 6 and 7, the dummy source plate 20B may overlap, in the vertical direction VD, with the logic circuit 120 in the peripheral region PR. The dummy source plate 20B may be maintained at a constant voltage regardless of whether the memory cell array 110 and the logic circuit 120 operate, thereby shielding the logic circuit 120 from ESD. The dummy source plate 20B may be disposed between top wiring lines TM1 and TM2 and bottom wiring lines UM1 to UM3 in the peripheral region PR. The dummy source plate 20B may be maintained at a constant voltage independent of voltages loaded to the top wiring lines TM1 and TM2 and the bottom wiring lines UM1 to UM3, thereby suppressing unnecessary coupling between the top wiring lines TM1 and TM2 and the bottom wiring lines UM1 to UM3.

Figure 8:
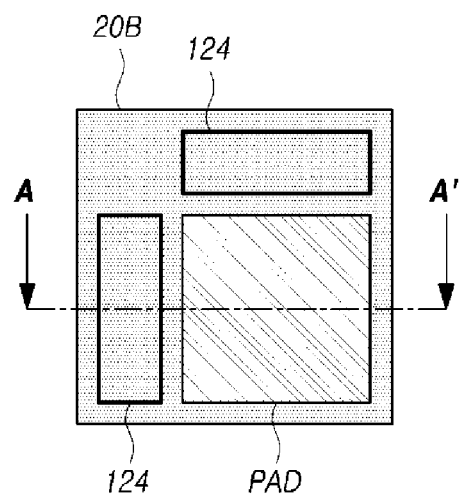
FIG. 8 is an enlarged top view illustrating a representation of a pad disposition region of a semiconductor memory device in accordance with an embodiment of the disclosure.
Figure 9:
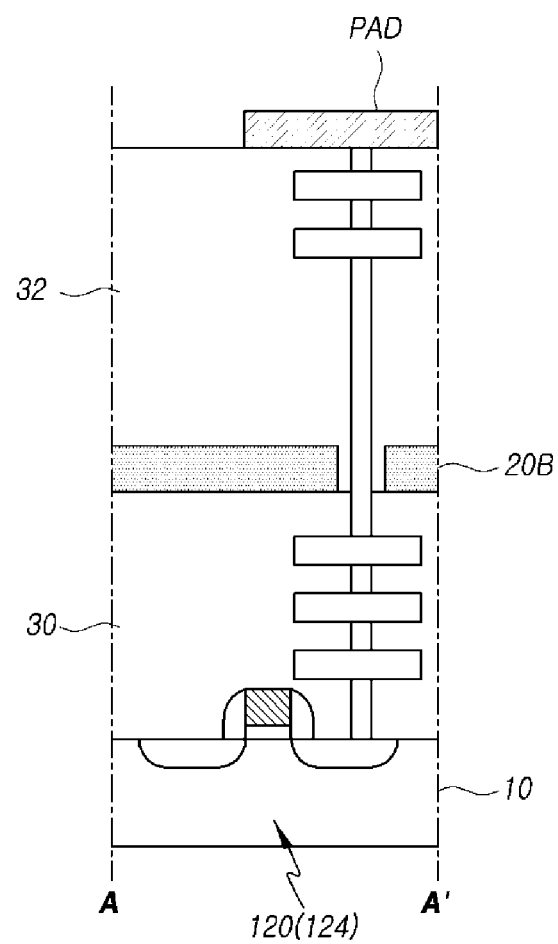
FIG. 9 is a cross-sectional view taken along line A-A' of FIG. 8.

FIG. 8 is an enlarged top view illustrating a representation of a pad disposition region of a semiconductor memory device in accordance with an embodiment of the disclosure, and FIG. 9 is a cross-sectional view taken along line A-A' of FIG. 8.

Referring to FIG. 8, when viewed from the top, a pair of ESD protection circuits 124 may be disposed adjacent to a pad PAD. In cases in which high-voltage static electricity is suddenly introduced when a power supply voltage or data is inputted to the pad PAD, the ESD protection circuits 124 may discharge the static electricity to an internal circuit.

Referring to FIG. 9, the pad PAD may be disposed on a top dielectric layer 32, and may be exposed to the outside of the top dielectric layer 32. In the vertical direction VD, the pad PAD may overlap with the dummy source plate 20B, which is defined or disposed between the top dielectric layer 32 and the bottom dielectric layer 30.

Each ESD protection circuit 124 may be defined or disposed on the substrate 10, and may be included in the logic circuit 120. The dummy source plate 20B may be disposed between the pad PAD and the logic circuit 120, and may overlap with the pad PAD and the logic circuit 120 in the vertical direction VD. The dummy source plate 20B may be maintained at a constant voltage independent of a voltage or data inputted to the pad PAD. When high-voltage static electricity is suddenly introduced when a power supply voltage or data is inputted to the pad PAD, the dummy source plate 20B may discharge the static electricity.

Figure 10A:
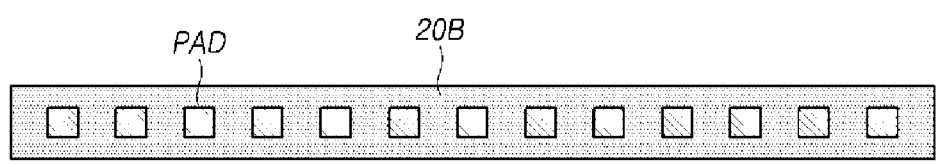
FIGS. 10A to 10C are top views illustrating examples of various shapes of a dummy source plate in the pad disposition region of semiconductor memory devices in accordance with embodiments of the disclosure.
Figure 10B:
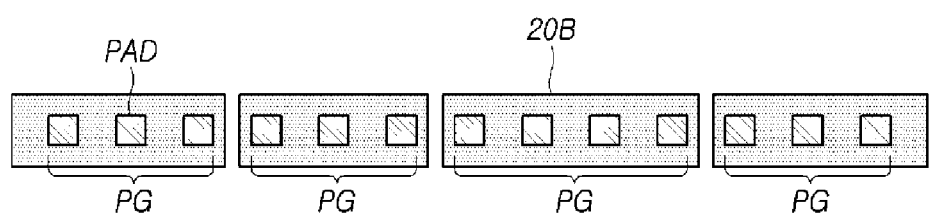
Figure 10C:
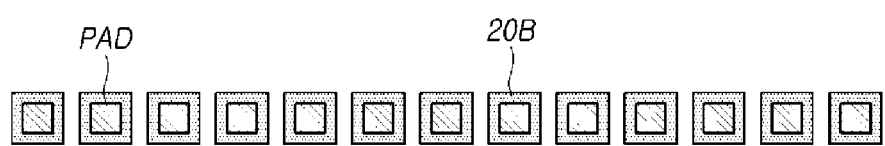

FIGS. 10A to 10C are top views illustrating examples of various shapes of a dummy source plate in the pad disposition region of semiconductor memory devices in accordance with embodiments of the disclosure.

Referring to FIG. 10A, the dummy source plate 20B may extend in the same direction as pads PAD arearranged. Dummy source plate 20B may have a continuous shape that overlaps with all of the pads PAD included in the semiconductor memory device.

In other embodiments, referring to FIG. 10B, the pads PAD may be grouped into a plurality of pad groups PG depending on the level of an applied voltage. For example, a similar level of voltage may be applied to pads PAD which are included in a single pad group PG. The dummy source plate 20B may be separated into a plurality of segments that correspond to the pad groups PG. In yet other embodiments, and referring to FIG. 10C, the dummy source plate 20B may be separated into a plurality of segments, each of which corresponds to a single pad PAD.

As is apparent from the above descriptions, according to the embodiments of the disclosure, by using a dummy source plate as an ESD shielding device, ESD is suppressed and prevented from being transferred to a logic circuit, so that it is possible to reduce damage to the logic circuit.

According to the embodiments of the disclosure, by shielding wiring lines lying under a memory cell array and wiring lines lying over the memory cell array from each other using a dummy source plate, it is possible to suppress unnecessary coupling between the underlying wiring lines and the overlying wiring lines. Consequently, the electrical characteristics of a semiconductor device may be improved, and limitations in laying out wiring lines due to deleterious coupling may be reduced to improve wiring line layout efficiency.

According to the embodiments of the disclosure, by utilizing the dummy source plate as a shield, it is not necessary to additionally form a separate structure for shielding the ESD. Therefore, by simplifying a process through removing manufacturing steps that are necessary to form separate structures for shielding, it is possible to reduce manufacturing cost and reduce failures likely to occur during manufacturing processes.

Figure 11:
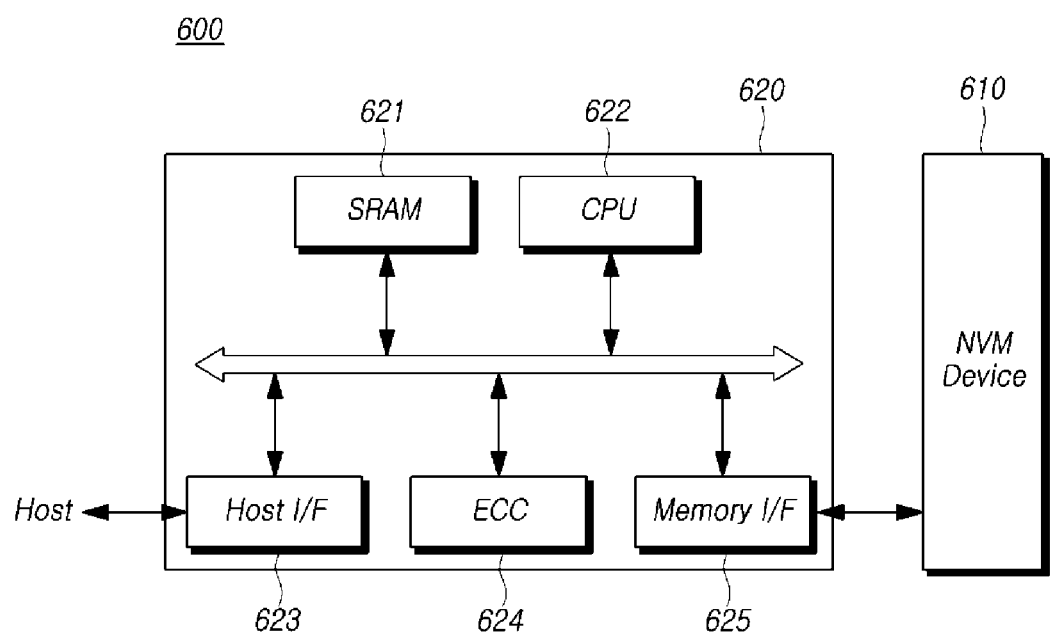
FIG. 11 is a diagram schematically illustrating a memory system including a semiconductor memory device in accordance with an embodiment of the disclosure.

FIG. 11 is a block diagram schematically illustrating a memory system including a semiconductor memory device in accordance with an embodiment of the disclosure.

Referring to FIG. 11, a memory system 600 in accordance with an embodiment may include a nonvolatile memory device (NVM Device) 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit (CPU) 622. A host interface (Host I/F) 623 includes a data exchange protocol of a host which is coupled with the memory system 600.

An error correction code block (ECC) 624 detects and corrects an error included in data read from the nonvolatile memory device 610.

A memory interface (Memory I/F) 625 interfaces with the nonvolatile memory device (NVM Device) 610 of the present embodiment. The processing unit (CPU) 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device (NVM Device) 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 12:
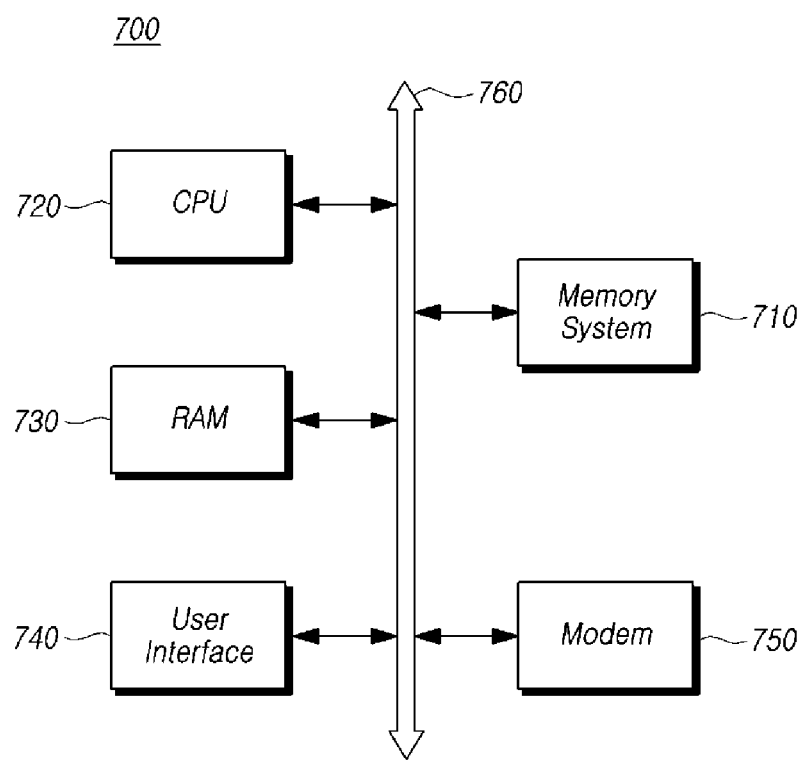
FIG. 12 is a block diagram schematically illustrating a computing system including a semiconductor memory device in accordance with an embodiment of the disclosure.

FIG. 12 is a block diagram schematically illustrating a computing system including a semiconductor memory device in accordance with an embodiment of the disclosure.

Referring to FIG. 12, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, an OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
a logic circuit disposed on a substrate having a cell region and a peripheral region outside the cell region;
a source plate defined over the logic circuit;
a slit separating the source plate into a cell source plate in the cell region and a dummy source plate in the peripheral region; and
a memory cell array defined on the cell source plate,
wherein the dummy source plate is loaded with a constant voltage independent of operations of the memory cell array and the logic circuit.

2. The semiconductor memory device according to claim 1, further comprising:
a top wiring line defined over the source plate;
a bottom wiring line defined between the logic circuit and the source plate; and
a contact coupling the top wiring line and the bottom wiring line in the peripheral region,
wherein the dummy source plate has an opening through which the contact passes.

3. The semiconductor memory device according to claim 1, wherein a portion of the logic circuit overlaps with the dummy source plate in a vertical direction perpendicular to a top surface of the substrate.

4. The semiconductor memory device according to claim 1, further comprising:
a plurality of pads that are exposed and defined in a top dielectric layer that covers the memory cell array, and that are spaced apart in the peripheral region,
wherein the dummy source plate overlaps with a least one of the plurality of pads in the vertical direction perpendicular to a top surface of the substrate.

5. The semiconductor memory device according to claim 4, wherein a portion of the logic circuit overlaps with a portion of the dummy source plate and at least one of the plurality pads in the vertical direction.

6. The semiconductor memory device according to claim 4, wherein the dummy source plate is continuous in shape and overlaps with all of the pads in the vertical direction.

7. The semiconductor memory device according to claim 4, wherein the pads are grouped into a plurality of pad groups, and the dummy source plate is separated into a plurality of segments, each corresponding to one of the plurality of pad groups.

8. The semiconductor memory device according to claim 4, wherein the dummy source plate is separated into a plurality of segments, each of which corresponds to one of the plurality of pads, respectively.

9. The semiconductor memory device of claim 1, wherein the dummy source plate is loaded with a ground voltage.

10. A semiconductor memory device comprising:
a logic circuit defined on a substrate having a cell region and a peripheral region outside the cell region;
a cell source plate disposed over the logic circuit in the cell region;
a memory cell array defined on the cell source plate; and
an electrostatic discharge shield plate disposed over the logic circuit in the peripheral region.

11. The semiconductor memory device according to claim 10, wherein the cell source plate and the electrostatic discharge shield plate are separated from each other by a slit along a boundary between the cell region and the peripheral region.

12. The semiconductor memory device according to claim 10, further comprising:
top wiring lines disposed over the cell source plate and the electrostatic discharge shield plate;
bottom wiring lines disposed in a bottom dielectric layer, which covers the logic circuit, between the cell source plate and the substrate and between the electrostatic discharge shield plate and the substrate; and
contacts coupling the top wiring lines and the bottom wiring lines in the peripheral region,
wherein the electrostatic discharge shield plate comprises openings through which the contacts pass.

13. The semiconductor memory device according to claim 10, wherein a portion of the logic circuit overlaps with a portion of the electrostatic discharge shield plate in a vertical direction perpendicular to a top surface of the substrate.

14. The semiconductor memory device according to claim 10, further comprising:
a plurality of pads arranged in the peripheral region and exposed to an outside of a top dielectric layer, which covers the memory cell array, wherein the electrostatic discharge shield plate overlaps with the plurality of pads in the vertical direction perpendicular to a top surface of the substrate.

15. The semiconductor memory device according to claim 14, wherein a portion of the logic circuit overlaps with a portion of the electrostatic discharge shield plate and at least one of the plurality of pads in the vertical direction.

16. The semiconductor memory device according to claim 15, wherein the electrostatic discharge shield plate is continuous in shape and overlaps with all of the plurality of pads.

17. The semiconductor memory device according to claim 16, wherein the plurality of pads are grouped into a plurality of pad groups, and the electrostatic discharge shield plate is separated into a plurality of segments that correspond to the plurality of pad groups.

18. The semiconductor memory device according to claim 16, wherein the electrostatic discharge shield plate is separated into a plurality of segments, each of the plurality of segments respectively corresponding to one of the plurality of pads.

19. A semiconductor memory device comprising:
a logic circuit defined on a substrate;
a source plate disposed over the logic circuit;
a slit separating the source plate into a plurality of cell source plates and a dummy source plate; and
a plurality of memory cell arrays defined on the cell source plates, respectively,
wherein the dummy source plate is loaded with a constant voltage regardless of whether the memory cell arrays and the logic circuit operate.

20. The semiconductor memory device according to claim 19, wherein
the cell source plates are disposed adjacent to one another in a first direction and a second direction that are parallel to a top surface of the substrate and intersect with each other, and
the dummy source plate is disposed between the adjacent cell source plates and at a periphery of the cell source plates.

* * * * *